United States Patent
Okada et al.

(10) Patent No.: US 8,653,612 B2
(45) Date of Patent: Feb. 18, 2014

(54) SEMICONDUCTOR DEVICE

(75) Inventors: Kazuo Okada, Ota (JP); Katsuhiko Kitagawa, Ota (JP); Hiroshi Yamada, Ebina (JP)

(73) Assignees: SANYO Semiconductor Co., Ltd., Gunma (JP); Semiconductor Components Industries, LLC, Phoeniz, AZ (US)

( * ) Notice: Subject to any disclaimer, the term of this patent is extended or adjusted under 35 U.S.C. 154(b) by 33 days.

(21) Appl. No.: 12/438,879

(22) PCT Filed: Aug. 22, 2007

(86) PCT No.: PCT/JP2007/066704
§ 371 (c)(1),
(2), (4) Date: Apr. 2, 2009

(87) PCT Pub. No.: WO2008/023827
PCT Pub. Date: Feb. 28, 2008

(65) Prior Publication Data
US 2010/0065929 A1    Mar. 18, 2010

(30) Foreign Application Priority Data
Aug. 25, 2006  (JP) .................................. 2006-229015

(51) Int. Cl.
*H01L 29/84* (2006.01)
(52) U.S. Cl.
USPC .................... 257/415; 257/678; 257/E31.127
(58) Field of Classification Search
USPC .......... 257/415, 432, 678, E31.127, E29.324; 438/65, 23, 118
See application file for complete search history.

(56) References Cited

U.S. PATENT DOCUMENTS

| 5,907,151 A | 5/1999 | Gramann et al. |
| 6,117,705 A | 9/2000 | Glenn et al. |

(Continued)

FOREIGN PATENT DOCUMENTS

| JP | 62-149155 | 7/1987 |
| JP | 08-078560 | 3/1996 |

(Continued)

OTHER PUBLICATIONS

Shinogi et al., U.S. Office Action mailed Aug. 29, 2011, directed to U.S. Appl. No. 12/438,888; 8 pages.

(Continued)

*Primary Examiner* — Chuong A Luu
*Assistant Examiner* — Nga Doan
(74) *Attorney, Agent, or Firm* — Morrison & Foerster LLP

(57) ABSTRACT

An object of the invention is to provide a smaller semiconductor device of which the manufacturing process is simplified and the manufacturing cost is reduced. Furthermore, an object of the invention is to provide a semiconductor device having a cavity. A device element 3 is formed on a front surface of a semiconductor substrate 4, and a sealing body 1 is attached to the semiconductor substrate 4 with an adhesive layer 6 being interposed therebetween. A main surface (a back surface) of the sealing body 1 which faces the semiconductor substrate 4 is curved inward, and there is a given space (a cavity 2) between the sealing body 1 and the semiconductor substrate 4. Since the back surface of the sealing body 1 is curved, the sealing body 1 is used as a planoconcave lens (a reverse direction) as well as a sealing member for the device element 3.

5 Claims, 3 Drawing Sheets

(56) References Cited

U.S. PATENT DOCUMENTS

| | | |
|---|---|---|
| 6,268,231 B1 | 7/2001 | Wetzel |
| 6,268,654 B1 | 7/2001 | Glenn et al. |
| 6,319,745 B1 | 11/2001 | Bertin et al. |
| 6,351,389 B1 | 2/2002 | Malladi |
| 6,566,745 B1 | 5/2003 | Beyne et al. |
| 6,596,117 B2 | 7/2003 | Hays et al. |
| 6,630,661 B1 | 10/2003 | Hoffman |
| 6,727,643 B2 * | 4/2004 | Suehiro ............. 313/499 |
| 6,759,266 B1 | 7/2004 | Hoffman |
| 6,885,107 B2 | 4/2005 | Kinsman |
| 6,979,597 B2 | 12/2005 | Geefay et al. |
| 7,026,758 B2 * | 4/2006 | Guenther et al. ............. 313/511 |
| 7,087,464 B2 | 8/2006 | Yu et al. |
| 7,154,173 B2 | 12/2006 | Ikeda et al. |
| 7,160,478 B2 * | 1/2007 | Leib et al. ............. 216/24 |
| 7,221,051 B2 | 5/2007 | Ono et al. |
| 7,282,806 B2 | 10/2007 | Hembree et al. |
| 7,564,496 B2 | 7/2009 | Wolterink et al. |
| 7,576,427 B2 | 8/2009 | Potter |
| 7,579,671 B2 | 8/2009 | Takao |
| 7,638,813 B2 | 12/2009 | Kinsman |
| 7,745,931 B2 | 6/2010 | Takao |
| 2003/0183921 A1 | 10/2003 | Komobuchi et al. |
| 2004/0169466 A1 * | 9/2004 | Suehiro et al. ............. 313/512 |
| 2004/0217703 A1 | 11/2004 | Wittmann et al. |
| 2005/0012169 A1 * | 1/2005 | Ikeda et al. ............. 257/432 |
| 2005/0101059 A1 | 5/2005 | Yang |
| 2005/0156260 A1 | 7/2005 | Partridge et al. |
| 2005/0236621 A1 | 10/2005 | Maeda et al. |
| 2006/0006511 A1 | 1/2006 | Roh et al. |
| 2006/0024919 A1 | 2/2006 | Yang |
| 2006/0131501 A1 * | 6/2006 | Ikushima et al. ............. 250/338.1 |
| 2006/0214975 A1 * | 9/2006 | Eguchi et al. ............. 347/19 |
| 2007/0075417 A1 | 4/2007 | Hwang et al. |
| 2008/0090335 A1 | 4/2008 | Morimoto et al. |
| 2008/0277672 A1 | 11/2008 | Hovey et al. |
| 2009/0008682 A1 | 1/2009 | Kusunoki et al. |
| 2009/0189238 A1 | 7/2009 | Kirby et al. |
| 2009/0206349 A1 | 8/2009 | Yamada et al. |
| 2009/0321903 A1 | 12/2009 | Shinogi et al. |

FOREIGN PATENT DOCUMENTS

| | | |
|---|---|---|
| JP | 09-061239 | 3/1997 |
| JP | 11-351959 | 12/1999 |
| JP | 2000-299396 A | 10/2000 |
| JP | 2001-298102 A | 10/2001 |
| JP | 2003-078121 A | 3/2003 |
| JP | 2003-204005 | 7/2003 |
| JP | 2005-019966 A | 1/2005 |
| JP | 2005-072554 A | 3/2005 |
| JP | 2005-209790 A | 8/2005 |
| JP | 2006-032940 A | 2/2006 |
| JP | 2006-100735 A | 4/2006 |
| WO | WO-2006/040986 | 4/2006 |

OTHER PUBLICATIONS

Yamada, H. et al., U.S. Office Action mailed Jan. 7, 2011, directed to U.S. Appl. No. 12/438,869; 10 pages.

Yamada et al., U.S. Office Action mailed Feb. 22, 2013, directed to U.S. Appl. No. 12/438,869; 9 pages.

Shinogi, H. et al., U.S. Office Action mailed Apr. 29, 2011, directed to U.S. Appl. No. 12/438,888; 7 pages.

Yamada et al., U.S. Office Action mailed Jul. 11, 2011, directed to related U.S. Appl. No. 12/438,869; 9 pages.

Office Action mailed Jun. 18, 2012, directed to U.S. Appl. No. 12/438,869; 9 pages.

Yamada, H. et al., U.S. Office Action mailed Jan. 18, 2012, directed to U.S. Appl. No. 12/438,869; 9 pages.

International Search Report mailed Nov. 13, 2007, directed to counterpart International Patent Application No. PCT/JP2007/066704; 2 pages.

Yamada et al., U.S. Office Action mailed Aug. 27, 2013, directed to U.S. Appl. No. 12/438,869; 10 pages.

* cited by examiner

SEMICONDUCTOR DEVICE

REFERENCE TO RELATED APPLICATIONS

This application is a national stage application under 35 USC 371 of International Application No. PCT/JP2007/066704, filed Aug. 22, 2007, which claims priority from Japanese Patent Application No. 2006-229015, filed Aug. 25, 2006, the contents of which are incorporated herein by reference.

FIELD OF THE INVENTION

The invention relates to a semiconductor device, particularly, a semiconductor device where an element formed on a semiconductor substrate is sealed.

DESCRIPTION OF THE RELATED ART

In recent years, a device using MEMS (Micro Electro Mechanical Systems), a CCD (Charge Coupled Device) used for an image sensor or the like, a CMOS sensor, a sensor electrically detecting infrared radiation (IR sensor), or the like have been developed.

These device elements are formed on a semiconductor die, and this completed semiconductor die is sealed in a sealing body. As such a sealing structure, there are a can package which seals an element with a metal cap, a ceramic package which seals an element with a ceramic cap, a tubular package which seals an element therein, and so on.

The relevant technique is described in Japanese Patent Application Publication Nos. hei 11-351959 and hei 9-61239, for example.

The conventional sealing structure has a problem of being large as a whole. Furthermore, the conventional sealing structure is formed by separately providing a semiconductor die formed with a device element and a sealing body and assembling these. This provides a complex manufacturing process in mass production, and accordingly increases the manufacturing cost.

SUMMARY OF THE INVENTION

Therefore, an object of the invention is to provide a smaller semiconductor device of which the manufacturing process is simplified and the manufacturing cost is reduced.

Furthermore, some semiconductor devices need have a cavity to effectively use. This is a case of sealing a device element in the cavity, for example. Other object of the invention is thus to provide a semiconductor device having a cavity.

The invention is to solve the above problem and the main feature is as follows. In detail, a semiconductor device of the invention includes: a semiconductor substrate formed with a device element on a front surface; and a sealing body having first and second main surfaces, being attached to the front surface of said semiconductor substrate with an adhesive layer being interposed therebetween, wherein the first main surface facing said device element is curved inward to provide a cavity between said sealing body and said semiconductor substrate.

In the semiconductor device of the invention, said first main surface and said second main surface on the opposite side thereto are curved inward.

A semiconductor device of the invention includes: a semiconductor substrate formed with a device element on a front surface; and a sealing body having first and second main surfaces, being attached to the front surface of said semiconductor substrate with an adhesive layer being interposed therebetween, wherein a step is formed in the first main surface facing said device element, a bottom portion of the step is flat, said first main surface and said second main surface on the opposite side thereto are curved inward, and a cavity is provided between said sealing body and said semiconductor substrate.

In the semiconductor device of the invention, the sealing body is attached to the front surface of the semiconductor substrate formed with the device element with the adhesive layer being interposed therebetween, and integrated as a die. This makes the device small as a whole. Furthermore, since the sealing body is integrated in the process of manufacturing the semiconductor device, an assembling process as has been conventionally performed is simplified and the manufacturing cost is minimized. Furthermore, since the main surface of the sealing body is curved, the cavity is formed in the sealing body and the sealing body is used as a lens.

DETAILED DESCRIPTION OF THE INVENTION

Figure 1:
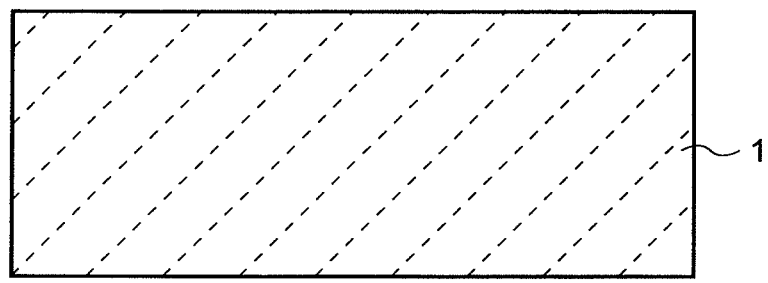
FIG. 1 is a cross-sectional view for explaining a semiconductor device of an embodiment of the invention.
Figure 2:
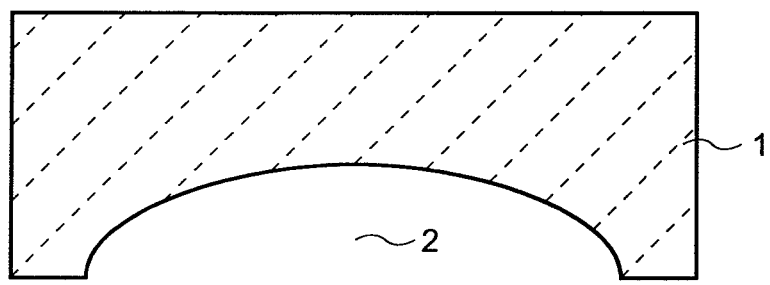
FIG. 2 is a cross-sectional view for explaining the semiconductor device of the embodiment of the invention.
Figure 3:
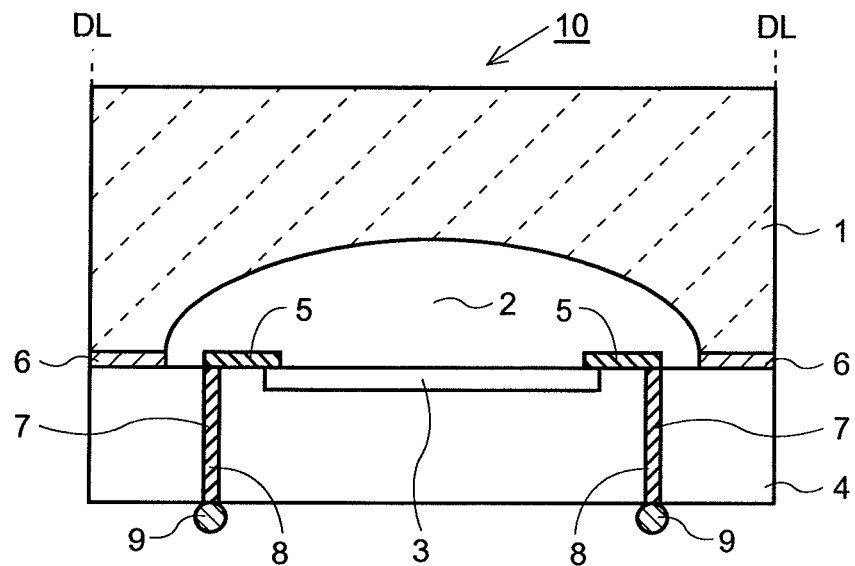
FIG. 3 is a cross-sectional view for explaining the semiconductor device of the embodiment of the invention.

An embodiment of the invention will be described referring to figures. FIGS. 1 to 3 are cross-sectional views shown in manufacturing order.

First, as shown in FIG. 1, a sealing body 1 such as a glass board or the like is provided. The sealing body 1 may be a board made of quartz, ceramic or metal, instead of glass, or made of resin (e.g. epoxy resin, acrylic resin, polyester resin or the like). The sealing body 1 has a function of sealing a semiconductor substrate 4 and protecting a surface of an element. When a device element 3 is a light receiving element or a light emitting element, the sealing body 1 is made of a transparent or semitransparent material and has a light transmitting property.

Then, as shown in FIG. 2, a curved cavity 2 is formed in the back surface of the sealing body 1 (the surface facing the semiconductor substrate) by etching, laser beam irradiation, sandblasting or the like. The cavity 2 is an inner space of the sealing body 1. The sandblasting is a method of processing an object by applying a jet of fine particles such as alumina, silica or the like to the object.

A predetermined thin film may be formed on the back surface of the sealing body 1 according to use of the semiconductor device after the cavity 2 is formed and before the sealing body 1 is attached to the semiconductor substrate 4. For example, by forming a layer which transmits light of a specific wavelength only on the back surface of the sealing body 1 by a film deposition technique such as a CVD (Chemical Vapor Deposition) method, a PVD (Physical Vapor Deposition) method or the like, the sealing body 1 is provided with a function of a filter layer (e.g. an infrared ray filter). Furthermore, when light should not enter the device element 3, a layer which absorbs light largely (e.g. a resin layer where a black pigment is added or the like) or a metal layer which reflects light (e.g. an aluminum layer or a copper layer) may be formed on the back surface of the sealing body 1 to provide the sealing body 1 with a function of a light block layer.

Then, as shown in FIG. 3, the semiconductor substrate 4 made of silicon (Si) or the like is provided, where the device element 3 (e.g. a light receiving element such as CCD, an infrared ray sensor, a CMOS sensor or the like, a light emitting element, or other semiconductor element) is formed on the front surface. The device element 3 may be a mechanical device such as a MEMS (Micro Electro Mechanical Systems) element. The MEMS is a device where a mechanical component, a sensor, an actuator, an electronic circuit or the like are integrated on a semiconductor substrate.

Wiring layers 5 are connected to the device element 3, extending therearound. The wiring layers 5 are electrically connected to conductive terminals 9 which will be described below, through which power is supplied to the device element 3.

Then, the back surface of the sealing body 1 (the surface formed with the cavity 2) and the front surface of the semiconductor substrate 4 (the surface formed with the device element 3) are positioned so as to face each other. Then, an adhesive layer 6 made of for example, epoxy resin is formed on the surface of the sealing body 1 or the semiconductor substrate 4, and these are attached to each other with the adhesive layer 6 being interposed therebetween.

It is preferable to attach the sealing body 1 and the semiconductor substrate 4 under a decompression condition so as to make the cavity 2 vacuum. Alternatively, these may be attached to each other in an atmosphere of inert gas (e.g. nitrogen) to fill the cavity 2 with inert gas. The vacuum cavity 2 or the cavity 2 filled with inert gas prevents corrosion or degradation of the sealed device element 3 due to oxidation or the like.

The quality of the semiconductor device sometimes reduces when the adhesive layer is located between the device element and the sealing body. For example, in a case where the device element is a light receiving element or a light emitting element, when an unnecessary substance which prevents light entering the device element even slightly (or light irradiating from the device element) is located between the sealing body and the device element, there arises a problem that the operation quality of the semiconductor device reduces. For example, a required refractive index is not obtained. Furthermore, there arises a problem that the adhesive layer is degraded when light of a specific wavelength such as a Blu-ray is applied to the adhesive layer, and the operation quality of the semiconductor device reduces due to the degraded adhesive layer.

Therefore, in the attachment, the adhesive layer 6 may be formed on the attachment surface of the sealing body 1 except the region formed with the cavity 2 only, instead of uniformly on the attachment surface of the sealing body 1 or the semiconductor substrate 4. This is because the degradation of the operation quality due to the adhesive layer 6 described above is minimized.

Then, backgrinding is performed to the back surface of the semiconductor substrate 4 using a back surface grinder to reduce the thickness of the semiconductor substrate 4 to a predetermined thickness (e.g. about 50 to 100 μm). The grinding process may be replaced by an etching treatment or a combination of the grinder and the etching treatment. There is also a case where the grinding process is not necessary depending on application or specification of an end-product and the initial thickness of the provided semiconductor substrate.

Then, the semiconductor substrate 4 is selectively etched from the back surface side to the front surface side to form a plurality of via holes 7 reaching the wiring layers 5.

Then, an insulation film (not shown) and a barrier layer (e.g. a titanium layer, a titanium nitride layer) are sequentially formed in the via holes 7, and penetrating electrodes 8 (e.g. made of copper, aluminum, an aluminum alloy or the like) electrically connected to the wiring layers 5 are formed by a plating method or a sputtering method. Then, a protection layer (not shown) (e.g. made of a solder resist) is formed on the back surface of the semiconductor substrate 4, having openings in regions for forming the conductive terminals 9.

Then, the conductive terminals 9 (e.g. made of solder, gold or nickel) electrically connected to the penetrating electrodes 8 are formed in the openings of the protection layer (not shown). The conductive terminals 9 are formed by, for example, a screen printing method, a plating method or a dispensing method. Although the conductive terminals 9 are formed immediately under the penetrating electrodes 8 in FIG. 3, a back surface wiring may be formed first and the conductive terminals 9 may be formed on the back surface wiring.

Then, these are cut along a dicing line DL, thereby completing individual semiconductor devices 10. As the method of dividing these into the individual semiconductor devices 10, there are a dicing method, an etching method, a laser cutting method or the like. The completed semiconductor devices are mounted on a circuit board or the like where an external electrode is pattern-formed.

In this manner, in the semiconductor device of the embodiment, the sealing body 1 is attached to the front surface of the semiconductor substrate 4 formed with the device element 3 with the adhesive layer 6 being interposed therebetween, and integrated as a die. This makes the device smaller as a whole. Furthermore, since the sealing body 1 is integrated with the semiconductor substrate 4, an assembling process as has been conventionally performed after dicing is simplified and the manufacturing cost is minimized.

Furthermore, the back surface of the sealing body 1 is curved. Therefore, a semiconductor device having a cavity is easily obtained. Furthermore, the sealing body 1 is used as a planoconcave lens (a reverse direction) as well as a sealing member for the device element 3. Therefore, the structure of the embodiment may be effectively used as a structure of a camera module having a planoconcave lens (a reverse direction).

Figure 4:
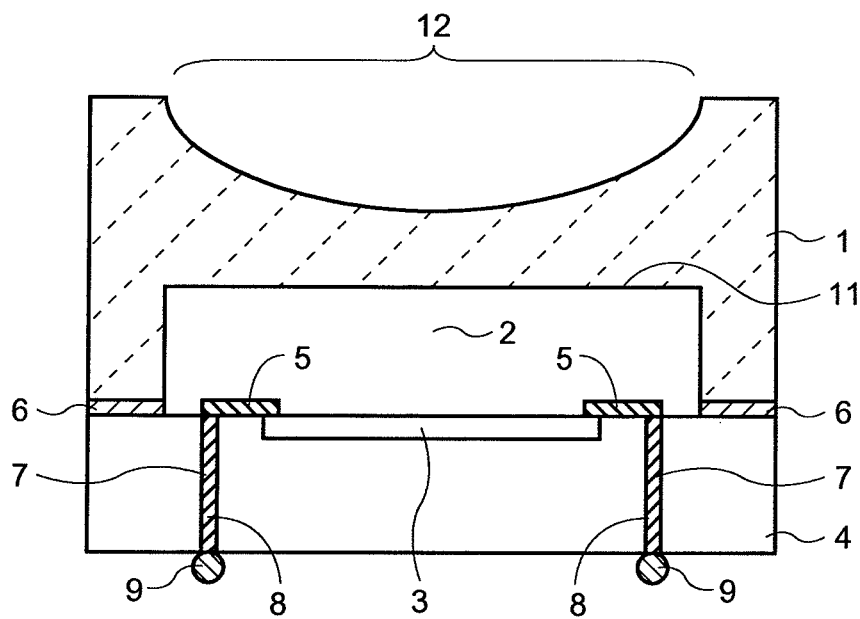
FIG. 4 is a cross-sectional view for explaining the semiconductor device of the embodiment of the invention.

Furthermore, although one surface (the back surface) of the main surfaces of the sealing body 1 which faces the semiconductor substrate 4 is curved in FIG. 3, the other surface (the front surface) may also be curved as shown in FIG. 4. Furthermore, in the structure of the semiconductor device 10 in FIG. 4, a step portion 11 having an almost flat bottom instead of a curved bottom is formed in the back surface of the sealing body 1. With this structure, a cavity is formed in the sealing body 1 and the sealing body 1 is used as a planoconcave lens (a forward direction).

Furthermore, since the front surface of the sealing body 1 is curved in this case, this space 12 is effectively used so as to make a device where the semiconductor device 10 is mounted thinner and smaller. For example, by disposing a filter member (e.g. a color filter, a filter which transmits a specific wavelength only) in this space 12, the device becomes smaller as a whole.

Figure 5:
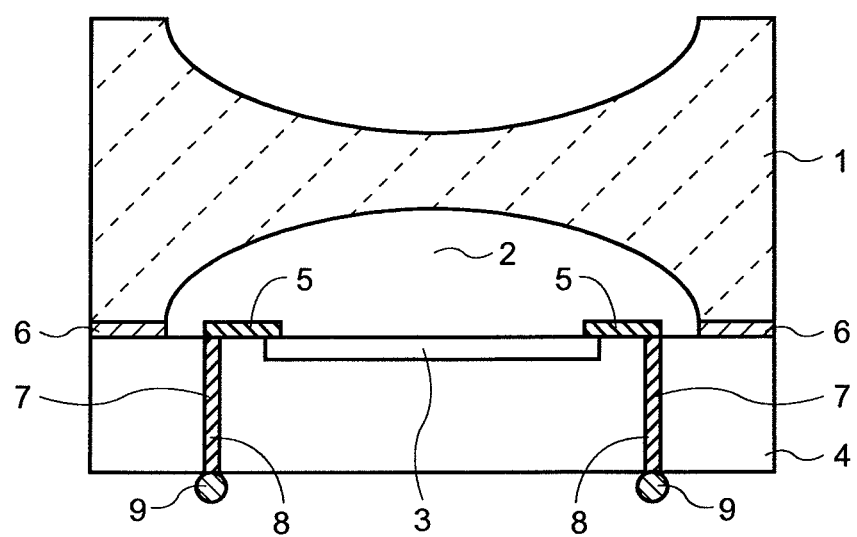
FIG. 5 is a cross-sectional view for explaining the semiconductor device of the embodiment of the invention.

Furthermore, as shown in FIG. 5, both the main surfaces of the sealing body 1 may be processed so as to be curved. The shapes of the two curves are symmetrical relative to the center of the sealing body 1. This structure provides cavities and the sealing body 1 is used as a double-concave lens. Although not shown, by changing the shape of the curve of the main surface of the sealing body 1, the sealing body 1 may be used as a planoconvex lens or a double-convex lens.

The invention is not limited to the embodiment described above, and modifications are possible within the scope of the invention. The invention is widely applicable to a semiconductor device using a sealing body.

For example, by performing etching, laser irradiation or the like to a specific region of the semiconductor substrate 4 (except the region for forming the via holes 7), a step portion may be formed in the front surface of the semiconductor substrate 4 and an element of various types including a MEMS element may be formed on the bottom of the step portion. With this structure, the space between the semiconductor substrate 4 and the sealing body 1 is increased by this step, and thus a thicker element may be formed on the front surface of the semiconductor substrate 4.

Although the BGA (Ball Grid Array) type semiconductor device is used in the above description, the invention may also be applied to an LGA (Land Grid Array) type semiconductor device which has no ball-shaped conductive terminal or other CSP type semiconductor device, or a flip chip type semiconductor device.

What is claimed is:

1. A semiconductor device comprising:
   a semiconductor substrate comprising a device element formed on a front surface of the semiconductor substrate;
   a sealing body having a first main surface and a second main surface and attached to the front surface of the semiconductor substrate; and
   an adhesive layer attaching the sealing body to the semiconductor substrate,
   wherein the first main surface facing the device element is curved inward so as to provide a cavity between the sealing body and the semiconductor substrate,
   the first main surface is curved such that no flat plane exists in the curved first main surface, and
   the second main surface is flat such that no curved portion exists in the second main surface above the device element.

2. The semiconductor device of claim 1, wherein the device element comprises a light receiving element, and the sealing body seals the device element.

3. The semiconductor device of claim 1, wherein the device element comprises a MEMS element.

4. The semiconductor device of claim 1, wherein the device element is formed of a semiconductor in the semiconductor substrate so as to be part of the semiconductor substrate.

5. The semiconductor device of claim 1, wherein the cavity is a vacuum or filled with an inert gas.

* * * * *